3,506,844
CIRCUIT DEVICE FOR CONTACT-FREE INTEGRATED CIRCUIT CONTROL MODULES

Ebbe Rohloff, Erlangen, Germany, assignor to Siemens Aktiengesellschaft, a corporation of Germany Filed Mar. 7, 1967, Ser. No. 621,334
Claims priority, application Germany, Mar. 17, 1966, S 102,572
Int. Cl. H02h 7/20
U.S. Cl. 307—202 1 Claim

ABSTRACT OF THE DISCLOSURE

An integrated-circuit module with two transistors series-connected between the voltage bus leads and an output connected to a circuit point between the two transistors, is provided with an inversely poled diode which is connected between the output and the one bus lead that carry the operating potential of the module.

My invention relates to modules for controlling, regulating or data-processing purposes, for example logic gate networks or flip-flops, which are designed as integrated or microelectronic circuits for minimizing the module space requirements and for reducing the number of defective products in the module manufacture. Integrated or microelectronic circuits, as well as their manufacture, such as by silicon integrated device technology, are well known as such. The known integrated or solid-state circuit technique comprises designing the modular network with a "totem-pole" output branch in which two transistors, preferably silicon planar transistors, have their respective emitter-collector paths connected in series between the voltage-bus leads that supply the module with operating current. Such solid-state integrated circuits with totem-pole output are sensitive to spurious voltages. For example, when positive voltage faults occur on the connecting lead between the output of one integrated-circuit module and the input of the next following module, the output of the totem-pole branch may be subjected to over-voltages of up to twice the feeder voltage amplitude. This may damage or destroy the semiconductor device components incorporated in the integrated circuit and may also result in delaying the signals many times longer than by the delays inherent in the circuitry proper.

It is an object of my invention to eliminate the above-mentioned shortcomings and to provide a network for solid-state integrated circuits which reliably eliminates the danger of excessive over-voltages occurring at the totem-pole output as a result of spurious voltages at the bus leads, and which also minimizes the occurrence of spurious signal delays.

According to the invention, I connect the totem-pole output of each integrated-circuit module, such as the output of a complete logic gate or multivibrator, with the operating potential of the feeder-voltage source through an additional diode which is poled in the blocking direction. Preferably, this diode is formed as an integral part of the integrated-circuit module; that is, the diode is produced by conventional silicon processing techniques on or within the same substrate or slab of silicon that carries the active semiconductor-device components as well as the inactive components such as constituted by the voltage-bus leads and interconnecting leads.

It would be possible to replace the diode by a resistor. Such a resistor, however, would only be capable of reducing the delay of signal transmission in the event of disturbing voltages, but could not also eliminate the simultaneously occurring over-voltages.

Figure 1:
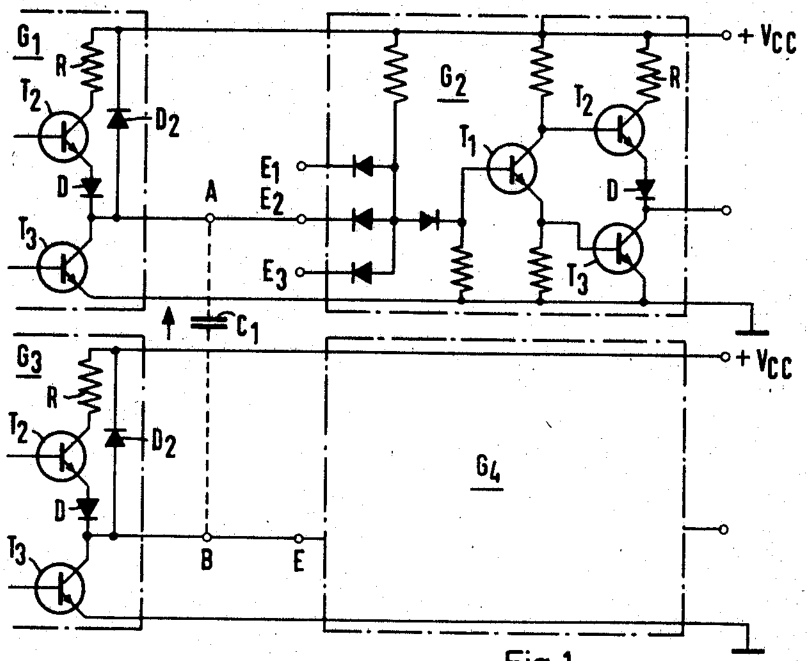
Figure 2:
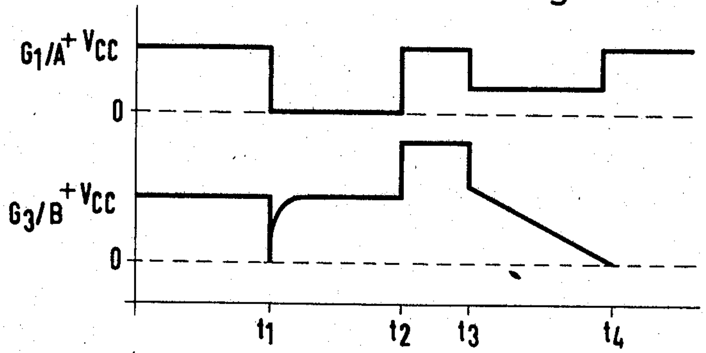
Figure 3:
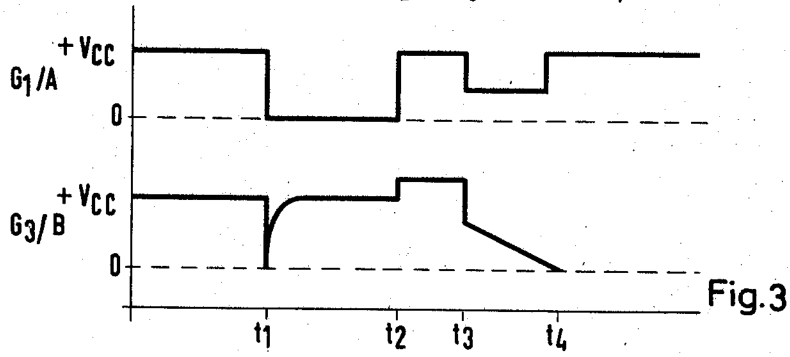

The invention will be further described with reference to an embodiment illustrated by way of example in the accompanying drawing, in which:

FIG. 1 is a schematic circuit diagram of a network composed of four individual integrated circuits, each constituting the logic gate module; and FIGS. 2 and 3 are explanatory graphs relating to the operation of the integrated circuits due to the provision of an inversely poled diode between the totom-pole output and the operational-potential bus of the modules.

The modular gates $G_1$ to $G_4$ represented in FIG. 1 may all have the same electrical design and performance, or they may differ from each other. These modules may constitute OR-gates, AND-gates, inverter stages, monostable multivibrators or other flip-flops, for example. The illustrated gate $G_2$ is an AND-gate and is shown in all of its circuit details. Of gates $G_1$ and $G_3$, only the output circuit branch, which is identical in all of the gates, is shown. This output branch constitutes the so-called "totem-pole" and comprises two silicon-planar type transistors which have their respective emitter-collector paths connected in series with each other and with a resistor R between the voltage buses that connect the module with the source of feeder current when the network of modules is in operation. The output A of gate $G_1$ is connected to the series connection of the two transistors $T_2$ and $T_3$, namely to a totem-pole point between the emitter of transistor $T_2$ and the collector of the transistor $T_3$. In many cases, and as shown, a diode D is inserted into the totem-pole connection. The outputs B of gate $G_3$ are also connected to the above-described circuit point between the transistors $T_2$ and $T_3$ in gate $G_3$.

Assume that the particular purpose to be served by the four-gate network shown in FIG. 1 requires the output A of gate $G_1$ to be connected with the input $E_2$ of gate $G_2$, and the output B of gate $G_3$ to be connected with the input E of the gate $G_4$, these connections being illustrated in FIG. 1. It is not always feasible to have the sequentially controlled modules of such and similar networks located in spacial proximity, one directly beside the other. There rather occurs the frequent necessity of connecting the output of one module, for example gate $G_1$, with the input of another module, for example gate $G_2$, situated at a remote locality. Assume, for example, that gates $G_1$ and $G_3$ are mounted close to each other within a control cabinet and that the respective outputs A and B of these gates must be connected with the inputs of remotely located modules, namely the inputs $E_2$ and E of the respective gates $G_2$ and $G_4$. Consequently, a connecting lead must be installed from output A of Gate $G_1$ to the input of gate $G_2$, and another long lead must extend from output B of gate $G_3$ to the input of gate $G_4$. In such cases, the connecting leads are usually joined together in parallel relation within a cable tree. Then, however, there exists a capacitive coupling between the two connecting leads and consequently between the two points A and B. This capacitive and distributed coupling is schematically represented by the capacitor $C_1$ in FIG. 1.

For further explanation, reference will be had to the voltage-time graphs shown in FIGS. 2 and 3. These graphs relate to the operation of the modular network according to FIG. 1 and denote, along their abscissa or time axis, four sequential moments $t_1$ to $t_4$ at which the gates $G_1$ and $G_3$ are turned on and off, as will be more fully described presently. The ordinates of the graphs denote the voltage amplitudes occurring at the output points A and B of respective gates $G_1$ and $G_3$.

Referring first to FIG. 2, the voltage-time curves of this graph apply to the illustrated modular network without the diodes $D_2$ in gates $G_1$ and $G_3$. Normally the outputs A and B of gates $G_1$ and $G_2$ are at a high potential so that the transistors $T_2$ and $T_3$ in both gates are turned off.

At moment $t_1$ a control pulse in the gate input circuit (not shown for gates $G_1$, $G_3$) causes the potential at output A of gate $G_1$ to drop from $+V_{cc}$ to zero volts. At moment $t_2$, the gate, $G_1$ is switched back to the off condition, and the potential at output A again increases to the operating potential $+V_{cc}$. When thereafter, at moment $t_3$, the transistor $T_3$ of gate $G_3$ is turned on, the potential $+V_{cc}$ at output B of gate $G_3$ is supposed to immediately drop to zero and to thus block the gate $G_4$. Due to the capacitive coupling $C_1$, however, the voltage at output B of gate $G_3$, had followed the voltage jump of output A at the moment $t_1$. Consequently, at moment $t_1$ the potential of output B momentarily decreases toward zero but then rapidly increases back to the operating potential $+V_{cc}$ during the interval in which the capacitance $C_1$ becomes charged through the resistor R of gate $G_3$ in the direction indicated in FIG. 1 by an arrow.

When at the moment $t_2$ the voltage at output A of gate $G_1$—as explained above—jumps to the potential $+V_{cc}$, the same voltage jump appears at output B of gate $G_3$. This jump is added to the voltage already present at output B, so that twice the feeder voltage, namely the voltage $2V_{cc}$ appears at point B. This high over-voltage may suffice to destroy the planar structures of the transistors, thus rendering them inoperative. This is because the charge at capacitance $C_1$ cannot dissipate since—seen from point B—all of the transistors and diodes are blocking at that moment. Only at the later moment $t_3$, at which the transistor $T_3$ of gate $G_3$ is to be turned on, can the capacitance $C_1$ commence to discharge. Then there occur at the outputs A and B the voltage jumps apparent from FIG. 2, but only after the voltage at output B has decayed to zero by discharge of the capacitance $C_1$, can the signal of output A become effective at the input of gate $G_2$. This occurs at the later moment $t_4$.

However, if according to the invention and as shown in FIG. 1, each of the gate outputs A and B is connected through an inversely poled diode $D_2$ with the voltage-bus lead carrying the operating potential $+V_{cc}$, the additional diode $D_2$ provides a discharging path for the capacitance $C_1$. As a result, the over-voltage at the moment $t_2$ is limited to the limit voltage of the diode $D_2$, as is apparent from the diagram in FIG. 3. It will also be seen from FIG. 3 that the signal delay between moments $t_3$ and $t_4$ is considerably reduced. It is desirable to provide for a smallest time constant of the discharge from capacitance $C_1$. For that reason, it is preferable to select a diode $D_2$ with the smallest feasible internal resistance in the forward direction.

Since the diode $D_2$ is to be connected on the one hand to the output of one module, and on the other hand to the operating potential $+V_{cc}$, both connecting points being accessible outside of the modules, the totem-pole output of such an integrated circuit can be subsequently provided with an additional diode $D_2$ as required by the invention. It is preferable, however, to integrate the diode $D_2$, like the other semiconductor components, into the integrated structure of the module with which the diode is to be equipped.

I claim:

1. A circuit device for contact-free integrated circuit control modules having an output circuit comprising two transistors connected in totem-pole output circuit arrangement which are connected to a current supply and voltage supply source and which have switching paths connected in series with the emitter electrode of one transistor being connected to the collector electrode of the other transistor whereby the output of one module of a group of modules is galvanically connected to the input of a module of another group of modules via a multi-wire connecting line, said circuit device comprising a diode poled in blocking direction relative to the operational voltage of said voltage supply source and integrated with the circuit for eliminating the signal delays caused by capacitative coupling influences and occurring between the individual parallel connecting lines, said diode being connected in parallel with the series connection of the switching path of one transistor and the working resistance of both transistors and connected to the common connection between the emitter electrode of one transistor and the collector electrode of the other transistor whereby said connection of the diode to said common connection constitutes the output of the circuit device.

References Cited

UNITED STATES PATENTS

| | | | |
|---|---|---|---|
| 3,173,022 | 3/1965 | Kunsch | 307—202 |
| 3,229,119 | 1/1966 | Bohn et al. | 307—215 |
| 3,230,429 | 1/1966 | Stehney | 307—202 X |

DONALD D. FORRER, Primary Examiner

S. D. MILLER, Assistant Examiner

U.S. Cl. X.R.

307—237, 246, 254, 303